United States Patent [19]

Komuro

[11] Patent Number: 5,377,151
[45] Date of Patent: Dec. 27, 1994

[54] SEMICONDUCTOR MEMORY DEVICE HAVING LOW-NOISE SENSE STRUCTURE

[75] Inventor: Toshio Komuro, Tokyo, Japan
[73] Assignee: NEC Corporation, Tokyo, Japan
[21] Appl. No.: 767,774
[22] Filed: Sep. 30, 1991

[30] Foreign Application Priority Data

Sep. 29, 1990 [JP] Japan .................. 2-261495

[51] Int. Cl.⁵ .......................................... G11C 7/06
[52] U.S. Cl. ............................... 365/208; 365/190;
365/203; 365/205; 365/63; 365/230.03; 327/51
[58] Field of Search .............. 307/530; 365/190, 207,
365/208, 203, 205, 63, 230.03

[56] References Cited

U.S. PATENT DOCUMENTS

| | | | |
|---|---|---|---|
| 4,287,576 | 9/1981 | Pricer | 365/208 |
| 4,367,540 | 1/1983 | Shimohigashi | 365/63 |
| 4,527,256 | 7/1985 | Giebel | 365/230.03 |
| 4,586,171 | 4/1986 | Fujishima | 365/208 |
| 4,799,197 | 1/1989 | Kodama et al. | 365/205 |
| 4,807,194 | 2/1989 | Yamada et al. | 365/207 |
| 4,807,195 | 2/1989 | Busch et al. | 365/207 |
| 4,903,344 | 2/1990 | Inoue | 365/207 |
| 5,018,100 | 5/1991 | Yanagisawa | 365/230.03 |
| 5,091,887 | 2/1992 | Asakura | 365/207 |

*Primary Examiner*—Joseph E. Clawson, Jr.
*Attorney, Agent, or Firm*—Sughrue, Mion, Zinn, Macpeak & Seas

[57] ABSTRACT

The semiconductor memory device according to this invention includes a memory cell array which comprises plural memory cells arranged in row and column direction in the form of an array, plural bit line pairs for connecting these memory cells in the unit of a column and word lines for connecting these memory cells in the unit of a row, sense amplifiers which are respectively connected to each of the bit line pairs at one end thereof and which amplify the potential difference between the bit lines of each pair in response to activation signals, and transfer gate means which divide said plural bit lines respectively into at least two portions corresponding to control signals, the sense amplifiers for the bit line pairs which belong to the nth columns (n is an odd numbered integer) thereof being arranged on one end of the bit line pairs and on the other end thereof for the those which belong to the (n+1)th columns. This construction of the device can prevent crosstalk which would otherwise caused between adjacent bit line pairs immediately after the sense amplifiers are activated.

5 Claims, 9 Drawing Sheets

SEMICONDUCTOR MEMORY DEVICE HAVING LOW-NOISE SENSE STRUCTURE

FIELD OF THE INVENTION

This invention relates to a semiconductor memory device and more particularly, to a semiconductor memory device which includes a plurality of bit line pairs and a plurality of sense amplifiers for amplifying potential differences in each pair of bit lines respectively.

DESCRIPTION OF THE PRIOR ART

A semiconductor memory device includes a memory cell array comprising plural memory cells arranged in the form of an array, plural bit lines connected respectively to these memory cells, and plural word lines connected similarly to the memory cells. Each of the plural bit lines of the memory cell array comprises a pair of bit lines which are complementarily applied with a certain voltage and a sense amplifier is provided for each of the bit line pairs. At the time of reading or writing operation or at the time of refreshing operation, the sense amplifiers are activated corresponding to sense amplifier activation signals to amplify the potential differences between two bit lines of each bit line pair.

Along with the high integration of such semiconductor memory device in recent years, however, the interval between the bit lines has become extremely narrow, and as a result, the parasitic capacitance therebetween increases to cause various problems. More particularly, when the potential difference between a pair of bit lines is smaller than a predetermined value due to fluctuation of characteristics of a transistor or a capacitance element of a memory cell, the output of the sense amplifier connected to the particular bit line pair delays in rise compared to other sense amplifiers (the output from a sense amplifier is quicker in rise as the potential difference between the bit lines of the pair increases). On the other hand, if the potential difference applied on a bit line pair adjacent to the pair of bit lines in question is larger than the predetermined value, then there is no delay in the sense amplifier connected to the latter pair of bit lines. But due to the parasitic capacitance between the pairs of the bit lines, crosstalk will occur between the output voltages from the two bit line pairs in response to the sense amplifier activation signals to cause errors in a reading out operation.

BRIEF SUMMARY OF THE INVENTION

Object of the Invention

An object of this invention is to provide a semiconductor memory device which can reduce the crosstalk between pairs of bit lines.

SUMMARY OF THE INVENTION

The semiconductor memory device according to this invention includes a memory cell array which comprises plural memory cells in the form of an array, plural bit line pairs and plural word lines which are connected respectively to the memory cells, sense amplifiers which are provided one each for each pair of bit lines and which amplify the potential difference between two bit lines of a pair in response to an activation signal, and transfer gates which divide the bit line pairs into at least two groups corresponding to a control signal. The semiconductor device is characterized in that the sense amplifiers connected to two adjacent pairs of bit lines are arranged axisymmetrical with respect to the transfer gates.

The semiconductor memory device preferably includes a power source line which supplies a constant potential and a connector means which controls the connection between the bit line pairs and the power source line in response to a precharge signal.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
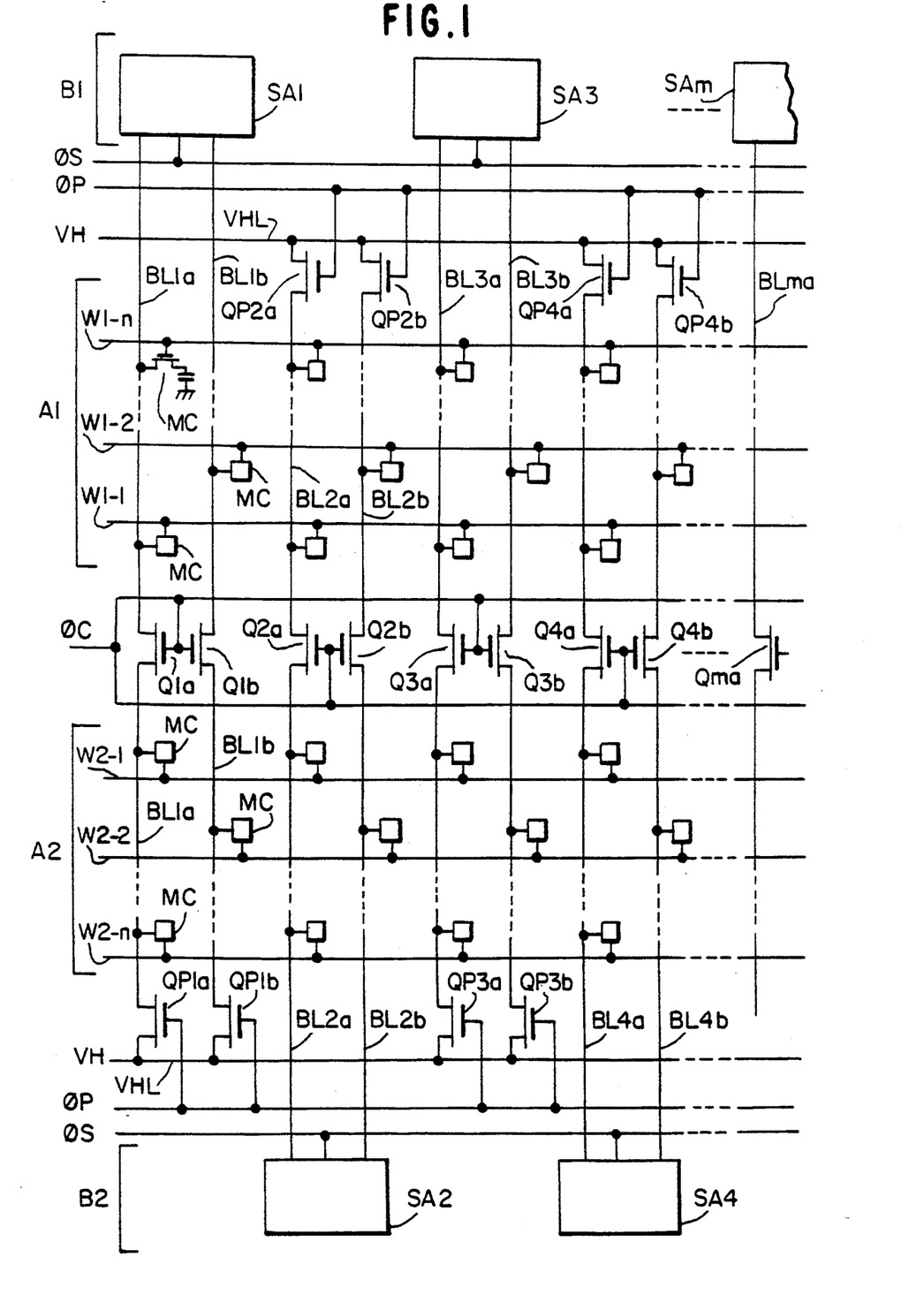
FIG. 1 is a circuit diagram to show the first embodiment of the semiconductor memory device according to this invention.

Referring now to FIG. 1, a memory cell array in this embodiment comprises plural memory cells MC each of which comprises one N channel transistor and one capacitor element and which are arranged in the form of an array in rows and columns (in other words, it comprises one-transistor-one capacitor type cells MC arranged in the form of an array). The bit lines are grouped into pairs (e.g. BL1a/BL1b, BL2a/BL2b, . . . ) each of which is connected respectively to a sense amplifier SA (e.g. SA1, SA2, . . . ). In order to avoid those sense amplifiers connected to adjacent bit line pairs from being arranged adjacent to one another, they are arranged in a region along the side parallel to a word line of the memory cell array (i.e. the region B1 of FIG. 1) and in a region along the side which is axisymmetrical to the first side (i.e. the region B2 of FIG. 1). More specifically, sense amplifiers SA1, SA3, . . . , Sam which are respectively connected to the bit line pair BL1a/BL1b, the bit line pair BL3a/BL3b not adjacent to the first pair, . . . and BLma/BLmb are arranged in the region B1 on the upper side of the figure while sense amplifiers SA2, SA4, . . . respectively connected to the bit line pair BL2a/BL2b, and BL4a/BL4b , . . . are arranged in the region B2 on the lower side of the figure.

The sense amplifiers SA1 through SAm are activated with sense amplifier activation signals φS to amplify the potential difference between the bit lines in a pair such as between BL1a and BL1b.

The bit lines (BL1a/BL1b, BL2a/BL2b , . . . , BLma/BLmb are respectively connected at the center thereof to the source/drain of transfer gate transistors Q1a/Q1b, Q2a/Q2b, and Qma/Qmb which are controlled ON/OFF in response to a control signal $\phi C$ supplied to the gates. The memory cell array is divided into the regions A1 and A2 by these transfer gate transistors Q1a/Q1b through Qma/Qmb.

The word lines of this embodiment comprise the word lines W1-1, W1-2 , . . . , W1-n arranged in the region A1 and the word lines W2-1, W2-2 , . . . , W2-n arranged in the region A2 (in this embodiment, the number of the word lines arranged in the region A1 is the same as that in the region A2).

Precharge transistors QP1a/QP1b, QP2a/QP2b , . . . , QPma/QPmb are provided between the bit line pairs BL1a/BL1b, BL2a/BL2b , . . . , BLma/BLmb and a power source line VHL which is maintained at a fixed potential VH, and those transistors are controlled ON/OFF by precharge signals $\phi P$.

Figure 2:
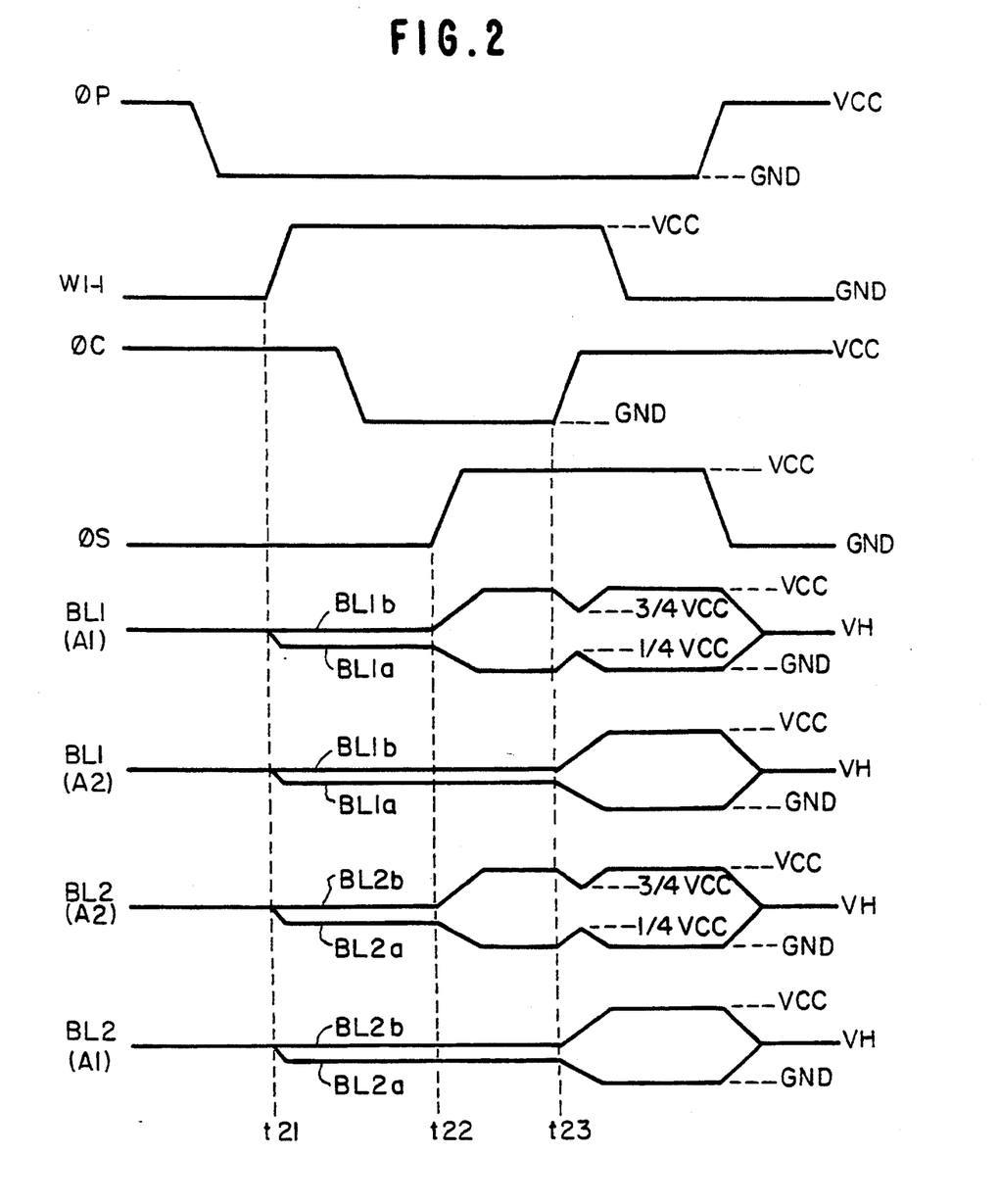
FIG. 2 is a waveform chart to explain the operations of the semiconductor device shown in FIG. 1.

Referring now to FIGS. 1 and 2, when a precharge signal $\phi P$ is shifted from a high to low level, all the precharge transistors QP1a/QP1b, QP2a/QP2b , . . . , QPma/QPmb become off-state to separate all the bit lines from the power source lines VHL electrically.

A line decoder (not shown) selects one word line (description will be given to the case where the word line W1-1 is selected herein) to shift the potential thereof to a high level. The data stored in the memory cell MC connected to the selected word line W1-1 are respectively represented by the potentials of respective bit lines (see the time t21 in FIG. 2). For instance, if a data of low level is stored in a memory cell connected to the bit line BL1a and the word line W1-1, the potential of the bit line BL1a becomes slightly lower than the potential VH, but if the data of high level is stored in the same memory cell, the potential of the bit line BL1a becomes slightly higher than VH conversely. (FIG. 2 shows the case where a low level data is stored).

Subsequently, when the control signal $\phi C$ becomes from high to low level, all the transfer gate transistors Q1a/Q1b, Q2a/Q2b , . . . , Qma/Qmb are placed in an off-state to separate electrically all the bit lines into those in the region A1 and those in the region A2. More particularly, the bit line pairs BL1a/BL1b, BL2a/BL2b , . . . , BLma/BLmb are divided into those electrically connected to the sense amplifiers SA1 through SAm and those separated electrically from the aforementioned sense amplifiers. As the sense amplifiers which are connected to the adjacent bit line pairs are, as mentioned above, arranged in two different regions respectively along the two axisymmetrical sides or in the regions B1 and B2 of FIG. 1, the bit line pair adjacent to a bit line pair connected electrically to a sense amplifier is separated electrically from the sense amplifier which is connected to a bit line pair adjacent to said first bit line pair. More specifically, as the control signal $\phi C$ is shifted from a high to low level, the sense amplifier SA2 becomes connected to the bit line pair BL2a/BL2b in the region A2, but the sense amplifiers SA1 and SA3 are separated electrically by the transfer gate transistors Q1a/Q1b and Q3a/Q3b from the bit line pairs BL1a, BL1b, BL3a and BL3b adjacent to above-mentioned bit line portions in the region A2.

As the sense amplifier activation signal $\phi S$ is shifted to a high level (at the time t22 in FIG. 2), all the sense amplifiers SA1, SA2, SA3 , . . . , SAm are activated to amplify the potential difference between the bit lines of each pair, BL1a/BL1b, BL2a/BL2b , . . . , BLma/BLmb. At this time point, as those bit line pairs are divided into two groups by the transfer gate transistors Q1a/Q1b, Q2a/Q2b , . . . , Qma/Qmb, only the output voltage from one half of the bit line pairs which are directly connected to the sense amplifiers is amplified by the sense amplifiers. As bit line pairs adjacent to the bit line pair which is electrically connected to a sense amplifier are electrically separated from the sense amplifier, the sense amplifier is not affected by crosstalk from the adjacent bit line pairs immediately after the activation signal $\phi S$ is shifted to a high level.

For example, even though the potential difference between the bit lines in the pair BL2a/BL2b in the region A2 is amplified by the sense amplifier SA2, those between the lines in the pairs BL1a/BL1b, and BL3a/BL3b adjacent to the pair in the same region A2 are not amplified, to thereby eliminate the effect of crosstalk (see BL1(A2) and BL2(A1) in FIG. 2).

After the potential difference in the bit line pair BL2a/BL2b is fully amplified by the sense amplifier SA2 and the control signal $\phi C$ reaches a high level (at the time t23 in FIG. 2), all the transfer gate transistors Q1a/Q1b through Qma/Qmb are turned ON, and the bit lines BL1a/BL1b, BL2a/BL2b , . . . , BLma/BLmb which have been divided into two groups in the regions A1 and A2 are electrically connected again to amplify the potential differences in all of the bit line pairs.

As the potentials of the other half of the bit line pairs which are eventually connected by the transfer gate transistors Q1a/Q1b through Qma/Qmb were not amplified up until this moment (e.g. BL1(A2), BL2(A1) etc.), potentials of the bit line pairs BL1a/BL1b, BL2a/BL2b , . . . , BLma/BLmb either drop respectively from Vcc by $\frac{1}{4}$ Vcc or increases by $\frac{1}{4}$ Vcc from GND immediately after the transfer gate transistors Q1a/Q1b through Qma/Qmb are turned ON, but will shortly be returned to the levels of Vcc and GND by the sense amplifiers SA1 through SAm. Subsequently, data at a new level amplified by the sense amplifiers SA1 through SAm will be stored in the memory cells MC.

Then, when the potential of the selected word line (W1-1 as mentioned above) reaches a low level, the connection between the bit lines and the memory cells MC is cut off. When the sense amplifier activation signal $\phi S$ becomes low, all the sense amplifiers become inactivated. When the precharge signal $\phi P$ becomes high, the precharge transistors QP1a/QP1b through QPma/QPmb are turned ON to electrically connect all the bit lines with the power source line VHL and to make their potentials shift to the fixed potential VH.

Figure 3:
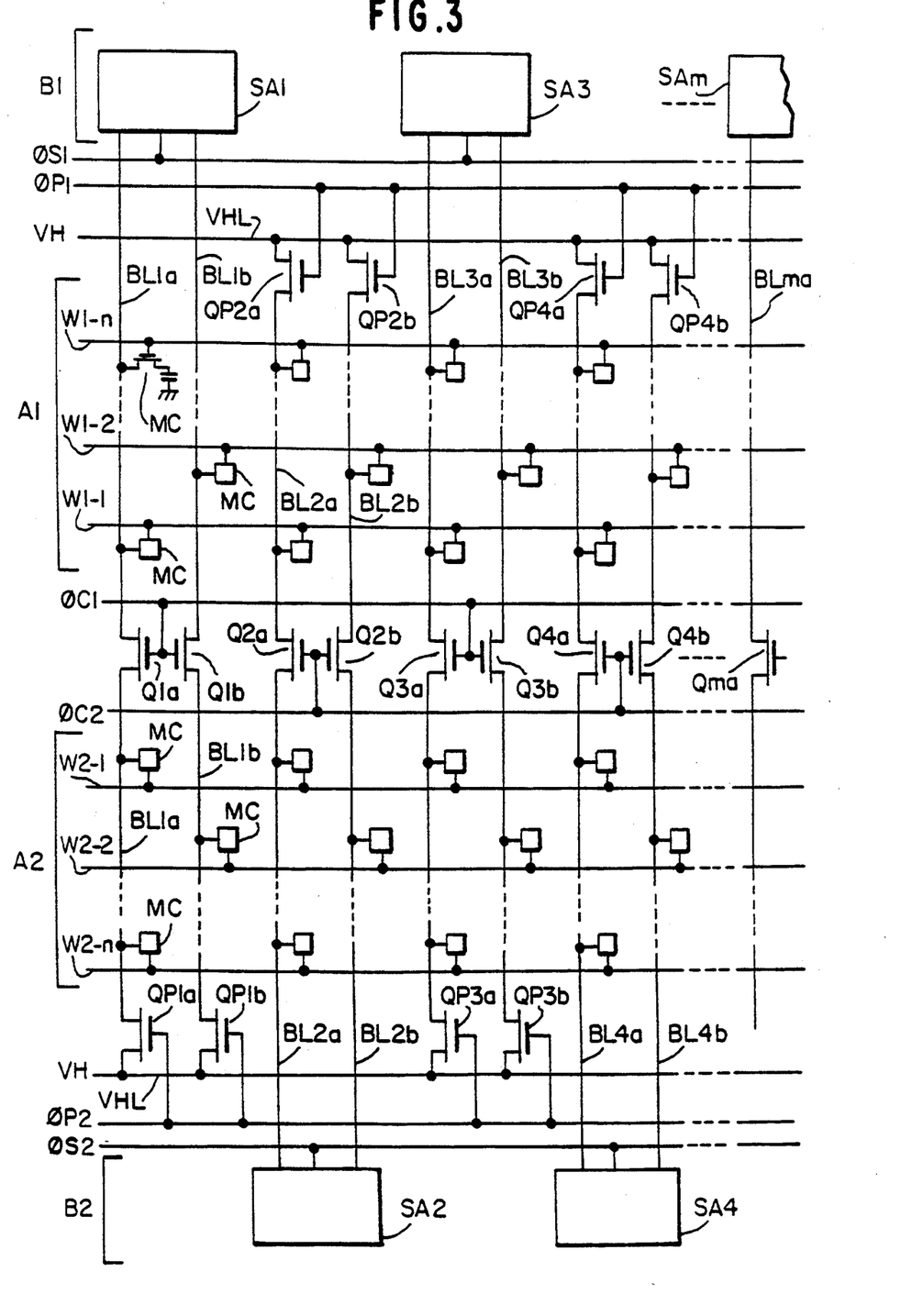
FIG. 3 is a circuit diagram to show the second embodiment of the semiconductor memory device according to this invention.

Referring now to FIG. 3, the second embodiment of this invention differs from the first embodiment only in that the control signal $\phi C$ of the first embodiment is replaced with the control signals $\phi 1$ and $\phi 2$, the precharge signal $\phi P$ with the precharge signals $\phi P1$ and $\phi P2$, and the sense amplifier activation signal $\phi S$ with the sense amplifier activation signals $\phi S1$ and $\phi S2$. The control signal $\phi C1$ is supplied to the gate electrodes of the transfer gate transistors Q1a/Q1b, Q3a/Q3b , . . . of the bit line pairs connected to the sense amplifiers SA1, SA3 , . . . , SAm arranged in the region B1. The control signal $\phi C2$ is supplied to the gates of the transfer gate transistors Q2a/Q2b, and Q4a/Q4b of the bit line pairs connected to the sense amplifiers SA2, SA4 , . . . arranged in the region B2. Similarly, the sense amplifier activation signal $\phi S1$ is supplied to the sense amplifiers SA1, SA3 , . . . in the region B1 while the signal φS2 controls the activation of the sense amplifiers SA2, SA4 , . . . in the region B2. The precharge signal φP1 is supplied to the precharge transistors QP2a/QP2b, QP4a/QP4b , . . . connected to the sense amplifiers SA1, SA3 , . . . SAm in the region B1 while the signal φP2 is supplied to the precharge transistors QP1a/QP1b, QP3a/QP3b , . . . connected to the sense amplifiers SA2, SA4 , . . . in the region B1. Except for the modification made on the first embodiment to allow the three groups of the signals φC1/φC2, φP1/φP2, and φS1/φS2 to be supplied, the second embodiment is identical to the first embodiment and detailed description is omitted.

Description will now be made on the case where a word line W1-1 in the region A1 is selected referring to FIG. 4.

The control signal φP1 which is generated based on the data in the row decoder when the word line W1-1 is selected is shifted to a low level, and the transfer gate transistors Q1a/Q1b, Q3a/Q3b , . . . of the bit line pairs BL1a/BL1b, BL2a/BL2b , . . . BLma/BLmb connected respectively to the sense amplifiers SA1, SA3 , . . . SAm in the region B1 are turned OFF. As the precharge signal φP1 is shifted to a low level, the bit line pairs BL2a/BL2b, BL4a/BL4b , . . . connected respectively to the sense amplifiers SA2, SA4 , . . . in the region B2 are electrically separated from the power source lines VHL. Under this state, the precharge signal φP2 is maintained at a high level.

In this state, out of the bit line pairs BL1a/BL1b, BL3a/BL3b , . . . only those in the region A1 are connected respectively to the sense amplifiers SA1, SA3 , . . . , SAm by the transfer gate transistors Q1a/Q1b, Q3a/Q3b , . . . and are separated from the power source lines VHL.

Figure 4:
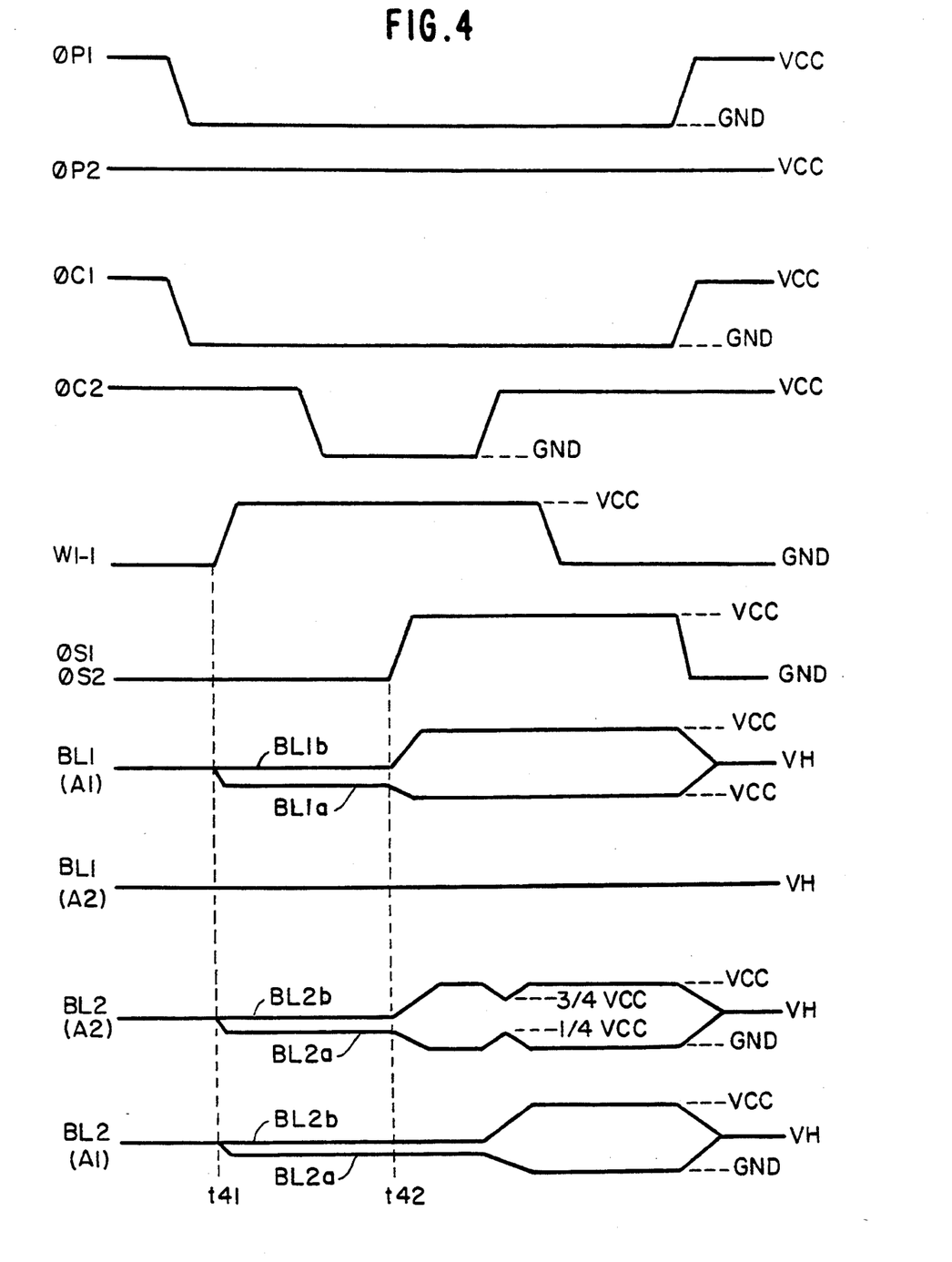
FIG. 4 is a waveform chart to explain the operations of the semiconductor memory device shown in FIG. 3.

Then, the word line W1-1 is selected by a line decoder (not shown) and the potential thereof becomes high (see the time point t41 in FIG. 4). The data stored in the memory cell MC connected to the selected word line W1-1 are reflected in each potential difference of the bit line pairs. As only the bit line pairs situated in the region A1 out of the bit line pairs BL1a/BL1b, BL2a/BL2b , . . . and BLma/BLmb are connected to the sense amplifiers SA1, SA3 , . . . and SAm by the transfer gate transistors, the length of the bit lines becomes substantially one half. This makes the potential difference in each bit line pairs twice as much as the prior art as well as makes the charge/discharge of each bit line one half. As those in the region A2 out of said bit line pairs are connected to the power source line VHL, they are maintained at the potential level of VH (see BL1(A1) and BL1(A2) in FIG. 4).

The potential differences in the bit line pairs BL2a/BL2b, BL4a/BL4b , . . . connected to the sense amplifiers SA2, SA4 , . . . in the region B2 reflect the data stored in the memory cells as in the case of the first embodiment (BL2(A1) and BL2(A2) of FIG. 4).

When the control signal φC2 is shifted from a high to low level, the transfer gate transistors Q2a/Q2b, Q4a/Q4b , . . . of the bit line pairs BL2a/BL2b, BL4a/BL4b , . . . are turned OFF. In this state, all the bit lines are divided into the regions A1 and A2 and substantially the same state as in the first embodiment is obtained except that the potentials of the bit lines in the pairs BL1a/BL1b, BL2a/BL2b , . . . , BLma/BLmb which are in the region A2 are kept at VH. In this manner, a portion of the bit line pairs which is adjacent to the portion of bit line pairs connected to the sense amplifiers can be separated from those sense amplifiers that are connected to said adjacent bit line pairs.

When the sense amplifier activation signals φS1 and φS2 are shifted to a high level (at the time t42 in FIG. 4), all the sense amplifiers are activated to amplify the potential differences from one half of the bit line pairs connected thereto respectively. As the output potential difference of bit line pairs adjacent to each other is not to be amplified by the sense amplifier connected to the other bit line pair adjacent thereto due to the above operation of the transfer gate transistors, crosstalk from the adjacent bit line pairs may be prevented.

After the potential differences of the bit line pairs are fully amplified by sense amplifiers SA1 through SAm, the control signal φC2 reaches a high level while the transfer gate transistors Q2a/Q2b, Q4a/Q4b , . . . are turned ON to thereby amplify the potential difference of the bit line pairs (BL2(A1) and BL2(A2) in FIG. 4). As the control signal φC1 remains at a low level on the other hand, the potential of the portion of the bit line pairs which are in the region A2 of the bit line pairs BL1a/BL1b, BL3a/BL3b , . . . is maintained at VH (BLa(A2) of FIG. 4).

Subsequently, the data of a new level which have been amplified by sense amplifiers are stored in the memory cells MC. Then the potential of the selected word line (in this case the line W1-1) becomes low, the connection between bit lines and the memory cells MC is cut off, and when the sense amplifier activation signals φS1 and φS2 are shifted to a low level, all the sense amplifiers are inactivated. Further, when the precharge signal φP1 and the control signal φC1 become respectively high, the potentials of all the bit lines are shifted to the fixed level of VH.

According to this embodiment, before the potential of the word lines is shifted to a high level in response to the selection thereof, the length of each bit line pairs becomes one half in substance due to the action of the transfer gate transistors as mentioned above, the potential difference at the time of data reading out from the memory cells becomes twice as much as the prior art while the charge/discharge of each bit line pair becomes one half. This reduces the power consumption for the memory cell array as a whole by 25%.

The description of the operations when the word line W1-1 is selected is applicable to the cases where any of the word lines such as W2-1, W2-2 situated in the region A2 is selected by replacing the precharge signal φP1 with φP2, the control signal φC1 with φC2, and the bit line pair BL1 with BL2. Otherwise, the basic operations are identical.

Although description has been made on assumption that the sense amplifier activation signals φS1 and φS2 have the same wave form, they may be different from each other. It is possible to reduce the difference in rising time of a sense amplifier by inputting the signal φS2 first because the potential difference from the bit line pair connected to the sense amplifier which is activated by the signal φS1 is about twice the potential difference from the bit line pair connected to the sense amplifier which is activated by the signal φS2. With this technique, as the time for charge/discharge for amplifying the output from bit line pairs by the sense amplifiers is divided by two, the peak current of the memory cell array may be prevented from increasing.

Figure 5:
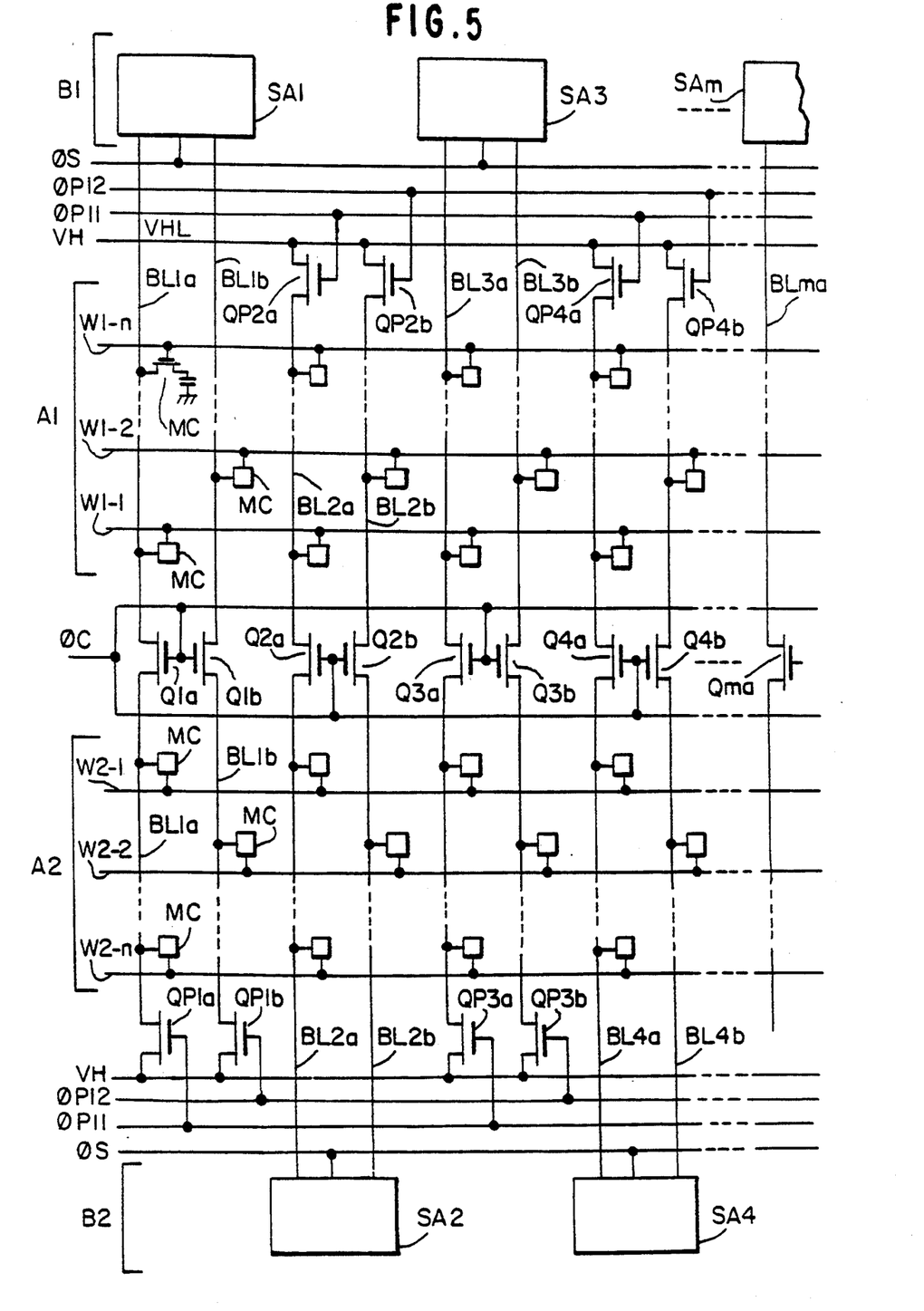
FIG. 5 is a circuit diagram to show the third embodiment of the semiconductor memory device according to this invention.

Referring to FIG. 5, the third embodiment of this invention is identical to the first embodiment except for that the precharge signal φP in the first embodiment is replaced with the signals $\phi P11$ and $\phi P12$. More particularly, the third embodiment is identical to the first embodiment in construction except that the precharge signal $\phi P11$ is to control activation of the precharge transistors QP1a, QP2a, QP3a , ... which connect one of the bit lines BL1a, BL2a, BL3a , ... , BLma of the pairs BL1a/BL1b, BL2a/BL2b , ... , BLma/BLmb while the precharge signal $\phi P12$ is to control the activation of the precharge transistors QP1b, QP2b, QP3b , ... which connect the other bit lines BL1b, BL2b, BL3b , ... with the power source line VHL. Therefore, detailed description is omitted.

Figure 6:
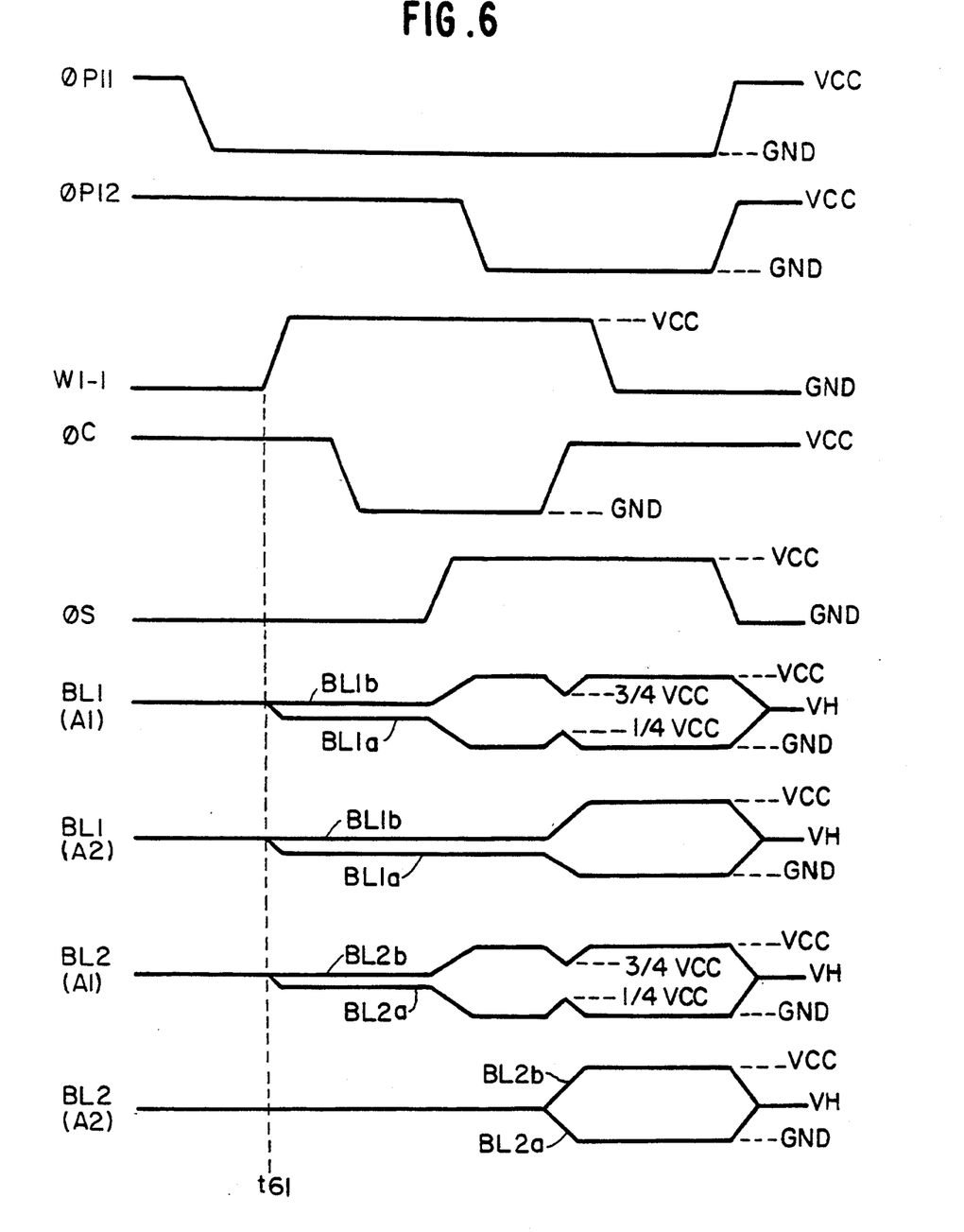
FIG. 6 is a waveform chart to explain the operations of the semiconductor memory device shown in FIG. 5.

Referring now to FIG. 6, the case where the word line W1-1 in the region A1 is selected will be described.

As the word line W1-1 is being selected, the precharge signal $\phi P11$ which is generated based on the data in the row decoder (not shown) becomes from high to low, and precharge transistors QP1a, QP2a, QP3a , ... are turned OFF. This separates one of the bit lines BL1a, BL2a, BL3a , ... , BLma in each pair from the power source line VHL electrically.

When the word line W1-1 is selected, the potential thereof is shifted to a high level. The data stored in the memory cell MC which is connected to the selected word line W1-1 is reflected in the potential in one of the bit lines BL1a, BL2a, BL3a, BLma (at the time 61 in FIG. 6) of each pair.

When the control signal $\phi C$ is shifted from a high to low level, all the transfer gate transistors Q1a/Q1b, Q2a/Q2b , ... are turned OFF and all the bit line pairs are divided into the portion in the region A1 and the portion in the region A2.

Then, the sense amplifier activation signal $\phi S$ is shifted to a high level, and all the sense amplifiers SA1, SA2, SA3 , ... , SAm are activated to amplify the potential differences of the bit line pairs BL1a/BL1b, BL2a/BL2b , ... , BLma/BLmb connected respectively to the sense amplifiers. As the bit line pairs are divided into two groups by the transfer gate transistors Q1a/Q1b, Q2a/Q2b , ... , the sense amplifiers SA1 through SAm amplify the potential differences from one half of each of the bit line pairs. Out of those portions of bit line pairs which are disconnected from the sense amplifiers, those of one of the bit lines BL1b, BL2b, BL3b , ... are kept at the power source potential VH. In this state, as the precharge signal $\phi P12$ is at a high level, the precharge transistors BL1b, BL2b, BL3b , ... are activated so that constant potential VH can be supplied through these transistors to the portion of the bit lines BL2b, BL4b in the region A1 and the portion of the bit lines BL1b and BL3b in the region A2 respectively. Therefore, immediately after the sense amplifier activation signal $\phi S$ is shifted high, one of the bit lines of each pair adjacent to the portion of the bit line pairs connected to the sense amplifiers or bit lines BL1b, BL2b, BL3b , ... are kept at the constant potential VH to prevent crosstalk.

After the potential differences of the bit line pairs are fully amplified by the sense amplifiers SA1 through SAm, the precharge signal $\phi P12$ is shifted to a low level, and all the bit lines are cut off from the power source line VHL, the control signal $\phi C$ is shifted to a high level and the bit lines BL1a/BL1b, BL2a/BL2b , ... , BLma/BLmb which were separated are connected electrically again to amplify the potential differences of all the bit line pairs by the sense amplifiers SA1 through SAm.

The operation thereafter is identical to that described in relation to the first embodiment except that the precharge signals $\phi P11$ and $\phi P12$ are shifted to a high level at the same timing as that for the precharge signal $\phi P$ in the first embodiment, and detailed description is omitted.

Figure 7:
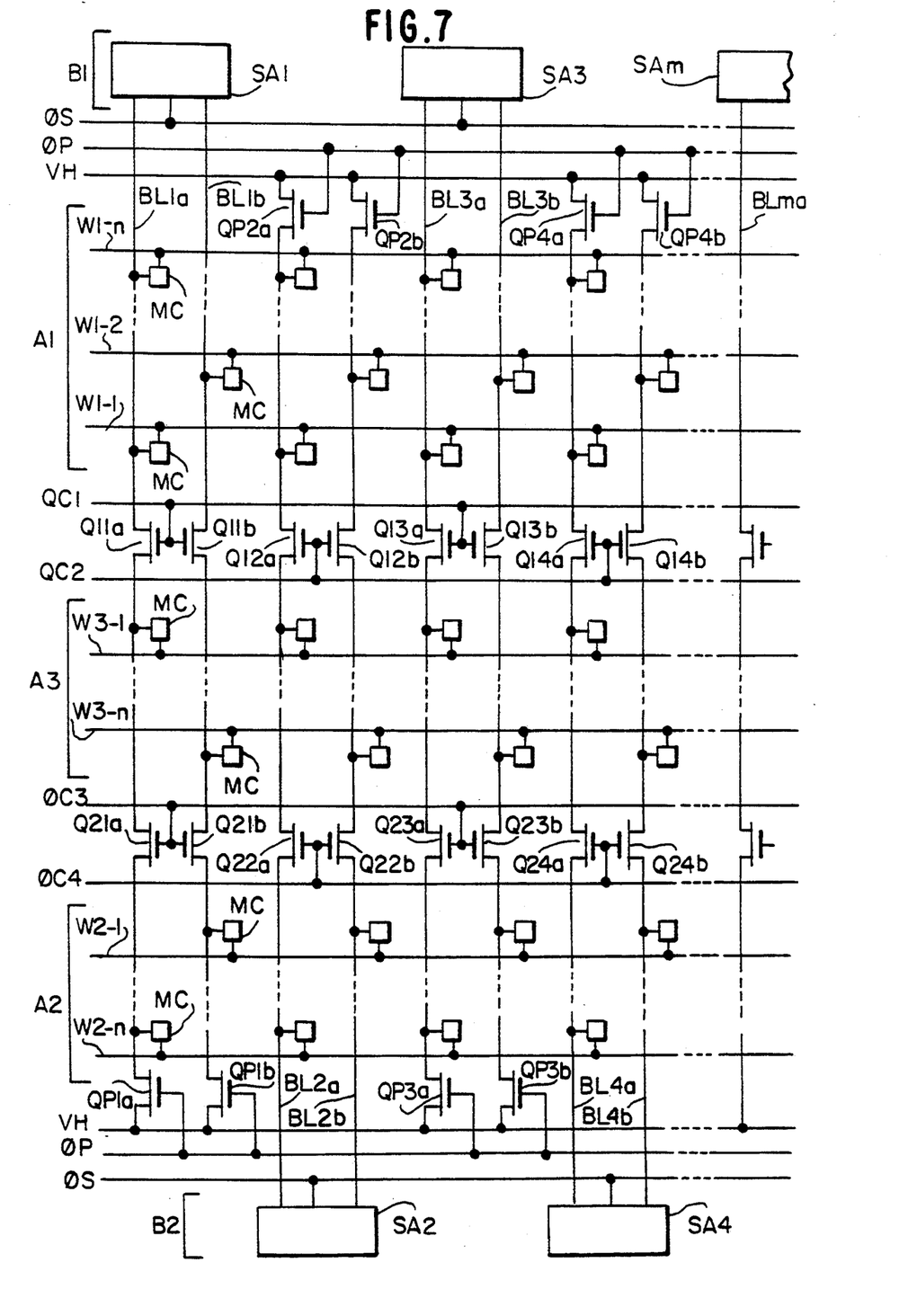
FIG. 7 is a circuit diagram to show the fourth embodiment of the semiconductor memory device according to this invention.

Referring now to FIG. 7, the fourth embodiment of this invention will be described. While a memory cell array is divided into two or the regions A1 and A2 in the aforementioned first to third embodiments, the memory cell array is divided into three regions of A1, A2 and A3 in this embodiment as each of the bit line pairs is provided with two transfer gates which are used respectively to divide the memory cell array. This embodiment includes transfer gate transistors Q11a, Q11b, Q12a, Q12b, Q13a, Q13b , ... which divide the memory cell array into the regions of A1 and A3 and transfer gate transistors Q21a, Q21b, Q22a, Q22b, Q23a, Q23b , ... which divide the memory cell array into the regions of A3 and A2. These transistors are controlled in energization with control signals $\phi C1$, $\phi C2$, $\phi C3$ and $\phi C4$ and are supplied with said precharge signals $\phi PC1$ through $\phi PC4$. Except for the modification, this embodiment is identical to the first embodiment and detailed description for the circuit construction thereof is omitted.

Exemplifying the case where the word line W1-1 in the region A1 is selected, the operation of the embodiment is described below referring to FIG. 8. The precharge signal $\phi P$ is shifted from a high to low level first and all the bit line pairs BL1a/BL1b, BL2a/BL2b , ... , BLma/BLmb are separated from the power source line VHL.

As the word line W1-1 is being selected, the control signal $\phi C1$ which is generated based on the data of the line decoder (not shown) is shifted from a high to low level to turn off the transfer gate transistors Q11a/Q11b, Q13a/Q13b , ... This makes only the portion of the bit line pairs BL1a/BL1b, BL3a/BL3b , ... which situate in the region A1 or one third of the whole are connected electrically to the sense amplifiers while the rest of them which are in the regions A2 and A3 or two thirds of the whole are cut off from the sense amplifiers.

Subsequently, the word line W1-1 is selected and the potential thereof is shifted to a high level. In this state, the data stored in the memory cell MC connected to the selected word line W1-1 are reflected in potential differences of the bit line pairs respectively, but the potentials of the bit line pairs which have been separated from the sense amplifiers by the transfer gate transistors Q11a/Q11b, Q13a/Q13b , ... are maintained at VH (BL1(A2, A3) in FIG. 8).

Then, the control signal C4 is shifted to a low level, the transfer gate transistors Q22a/Q22b, Q24a/Q24b , ... are turned OFF, and one third of the bit line pairs BL2a/BL2b, BL4a/BL4b , ... or those in the region A2 are connected to the sense amplifiers SA1, SA4 , ... while the rest of them or two thirds thereof are cut off from the sense amplifiers.

At this time point, the effective length of each of the bit line pairs becomes one third due to the transfer gate transistors Q11a/Q11b, Q13a/Q13b , ... and Q22a/Q22b, Q24a/Q24b , ... Then, under this state, the sense amplifier activation signal $\phi S$ is shifted to high level to activate all the sense amplifiers SA1 through SAm so as to amplify the potential difference from the one third of the bit line pairs of the effective length.

Then, the control signal φC4 is shifted to a high level and the transfer gate transistors Q22a/Q22b, Q24a/Q24b, ... are turned ON. This makes the output from the bit line pairs in the regions A1 and A3 or the two thirds of the bit line pairs BL2a/BL2b, BL4a/BL4b, ... to be amplified. The potential of the bit line pairs is shifted by ⅓ Vcc but is returned either to the voltage level. Vcc or GND shortly (BL2(A2, A3) and BL2(A1) in FIG. 8).

Figure 8:
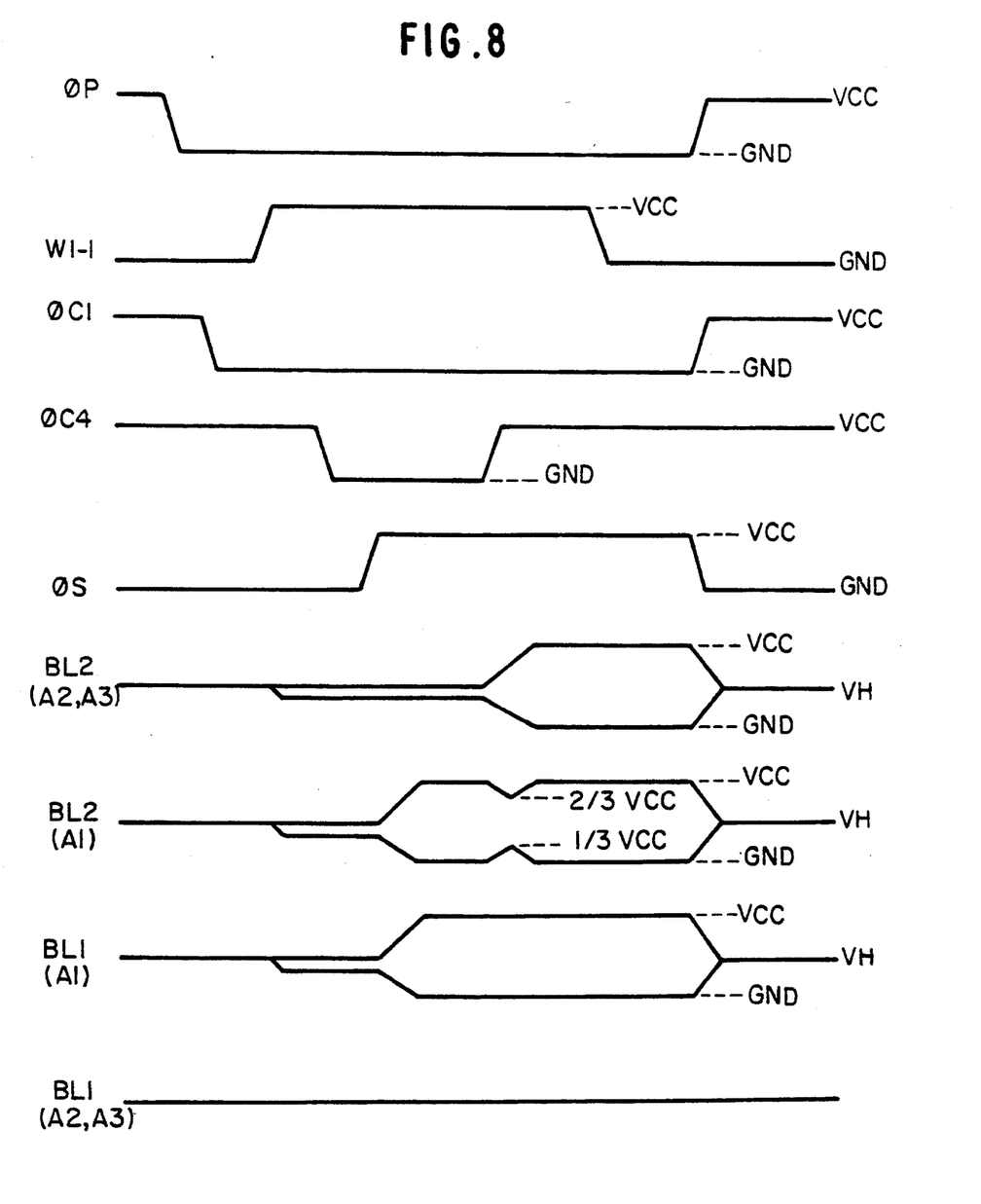
FIGS. 8 and 9 are waveform charts to explain the operations of the semiconductor memory device shown in FIG. 7.

As the control signal φC1 remains at a low level, the portion of the bit line pairs BL1a/BL1b, BL3a/BL3b, ... which are in the regions A2 and A3 are maintained at the potential of VH while the portion in the region A1 is kept at the same potential without change (BL1(A1) and BL1(A2, A3) of FIG. 8).

The operations hereafter are identical to the operations described for the first embodiment in relation to FIG. 2 except that the control signal φC1 rises in synchronization with the fall of the sense amplifier activation signal φS, and detailed description therefor is omitted (in the above operation, the control signals φC2 and φC3 are maintained at a high level).

The above description for this embodiment is applicable to cases where the word lines W2-1, ..., W2-n are selected. In that case, the control signal φC1 should be replaced with φC3 and the control signal φC4 with φC2 respectively.

Figure 9:
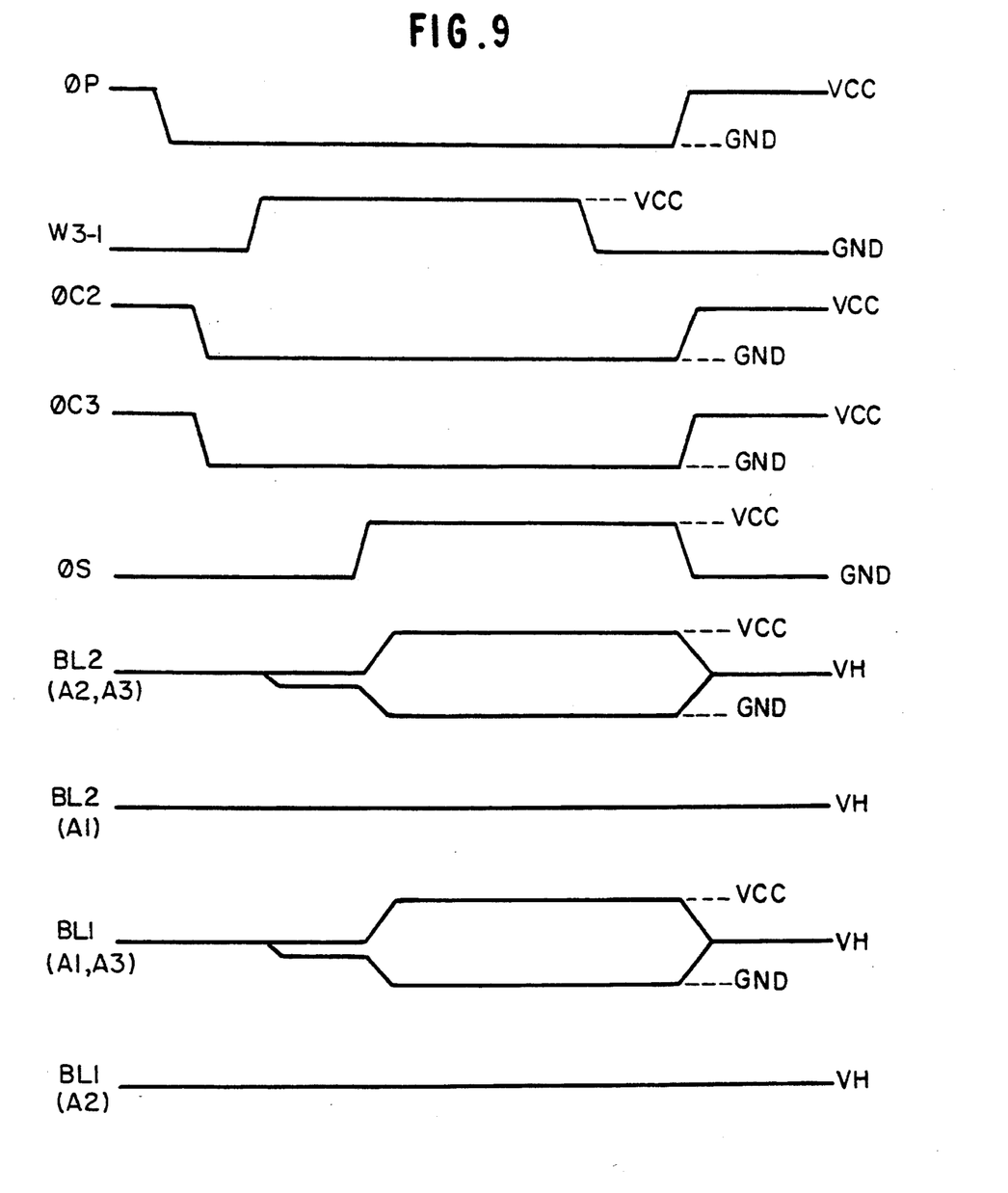

Operation of this embodiment will now be described referring to FIG. 9 for the case where the word line W3-1 in the region A3 is selected. The precharge signal φP is shifted to a low level, and all the bit line pairs BL1a/BL1b, BL2a/BL2b, ..., BLma/BLmb are cut off from the power source line VHL.

As the word line W3-1 is being selected, the control signals φC2 and φC3 are shifted from a high to low level, and the transfer gate transistors Q12a/Q12b, Q14a/Q14b, Q21a/Q21b, Q23a/Q23b, ... are turned OFF. Therefore out of the bit line pairs BL1a/BL1b, BL3a/BL3b, ..., only those in the regions A1 and A3 are connected to the sense amplifiers while out of the bit line pairs BL2a/BL2b, BL4a/BL4b, ... those within the regions A2 and A3 are connected to the sense amplifiers, and the rest of the bit line pair portions or one third thereof is separated therefrom.

Then, the word line W3-1 is selected and the potential thereof becomes high. The data stored in the memory cell MC connected at the selected word line W3-1 are reflected in the potential difference between the bit line pairs of which the effective length has become two thirds. The potential of the remaining one third of said bit line pairs is kept at the level of VH (see BL1(A2) of FIG. 8).

Then, the sense amplifier activation signal φS is shifted to high level, and all the sense amplifiers SA1 through SAm are activated so that the potential difference from the bit line pairs of which effective length has been reduced to two thirds of the whole is simplified by the sense amplifiers connected thereto.

The operations thereafter are identical to those of the first embodiment which is explained in relation to FIG. 2 except that the control signal φC2 rises simultaneously with the fall of the sense amplifier activation φS, and the detailed description therefor is omitted.

As described in the foregoing statement, this embodiment can prevent crosstalk between adjacent bit line pairs which would otherwise occur immediately after the sense amplifier activation signal is shifted to a high level.

Similarly to the third embodiment, this embodiment can have the same effect as the third embodiment by giving different signals for each of the bit line pairs.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

I claim:

1. A semiconductor memory device comprising:
a plurality of pairs of bit lines arranged in a plurality of columns, each of said pairs of bit lines being divided into a pair of first partial bit lines and a pair of second partial bit lines;
a plurality of pairs of transfer gate transistors, each of said pairs of transfer gate transistors being connected between one of said pair of first partial bit lines and one of said pair of second partial bit lines, said pairs of transfer gate transistors being brought into one of a conductive state for forming an electrical path between said pairs of first partial bit lines and said pairs of second partial bit lines and a nonconductive state for electrically isolating said pairs of first partial bit lines and said pairs of second partial bit lines in response to control information supplied thereto;
a plurality of word lines arranged in rows, said word lines including a first group of word lines intersecting said pair of first partial bit lines in each of said pairs of bit lines and a second group of word lines intersecting said pair of second partial bit lines in each of said pairs of bit lines;
a plurality of memory cells including a first group of memory cells each disposed at a different one of intersections of said first group of word lines and said first partial bit lines and a second group of memory cells each disposed at a different one of intersections of said second group of word lines and said second partial bit lines;
a plurality of first sense amplifiers, each of said first sense amplifiers being connected an associated one of even-numbered ones of said pairs of bit lines;
a plurality of second sense amplifiers, each of said second sense amplifiers being connected to an associated one of odd-numbered ones of said pair of bit lines; and
control means for supplying said control information to cause each of said pairs of transfer gate transistors to be changed from said conductive state to said nonconductive state after one of said word lines is selected and thereafter to be conductive state while said one of said word lines is being selected, said control means supplies said control information to cause alternate ones of said pairs of transfer be changed from said conductive state to said nonconductive state before one of said word lines is selected while said pairs of transfer gate transistors are held in said conductive state, and said remaining ones of said pairs of transfer gate transistors are changed from said conductive state to said nonconductive state after said one of said word lines is selected and thereafter changed to said conductive state while said one of said word lines is being selected.

2. The memory device as claimed in claim 1, wherein said alternate ones of said pairs of transfer gate transistors are the pairs of transfer gate transistors provided for said even-numbered ones of said pairs of bit lines when said one of said word lines belongs to said first group of word lines and said alternate ones of said pairs of transfer gate transistors are the pairs of transfer gate transistors provided for said odd-numbered ones of said pairs of bit lines when said one of said word lines belongs to said second group of word lines.

3. A semiconductor memory device comprising:
a memory cell array having a plurality of memory cells arranged in a plurality of rows and a plurality of columns, a plurality of word lines provided correspondingly to said rows, respectively, a plurality of pairs of bit lines provided correspondingly to said columns, respectively, each of said pairs of bit lines being divided into a pair of first partial bit lines and a pair of second partial bit lines, and a plurality of pairs transfer gates, each of said pairs of transfer gates being connected between a respective one of said pairs of first bit lines and one of said pairs of second bit lines;
a plurality of first sense amplifiers arranged along a first side of said memory cell array, each of said first sense amplifiers being connected to an associated one of even-numbered ones of said pairs of bit lines; and
a plurality of second sense amplifiers arranged along a second side of said memory cell array, each of said second sense amplifiers being connected to an associated one of odd-numbered ones of said pairs of bit lines, said first and second sides of said memory cell array being parallel and opposite to each other; and
control means for causing alternate ones of said pairs of transfer gates to be rendered unconductive before one of said word lines is selected while remaining ones of said pairs of transfer gates are conductive, and causing said remaining ones of transfer gates to be rendered nonconductive after said one of said word lines is selected, followed by activating each of said first and second sense amplifiers, said remaining ones of said pairs of transfer gates being thereafter rendered conductive while each of first and second sense amplifiers is being activated.

4. The semiconductor memory device as claimed in claim 3, further comprising a plurality of first precharge gates arranged along said first side and a plurality of second precharge gates arranged along said second side, said first precharge gates being provided for said odd-numbered ones of said pairs of bit lines and said second precharge gates being provided for said even-numbered ones of said pairs of bit lines, and each of said first and second precharge gates being activated to precharge an associated one of said pairs of bit lines.

5. The semiconductor memory device as claimed in claim 4, wherein one of said first and second precharge gates is deactivated before said one of said word lines is activated, and the other of said first and second precharge gates is maintained to be activated while said one of said word lines is being selected.

* * * * *

UNITED STATES PATENT AND TRADEMARK OFFICE
CERTIFICATE OF CORRECTION

PATENT NO. : 5,377,151
DATED : December 27, 1994
INVENTOR(S) : Toshio Komuro

It is certified that error(s) appears in the above-identified patent and that said Letters Patent is hereby corrected as shown below:

Col. 10, line 59, after "transfer" insert --gate transistors to--.

Signed and Sealed this

Eighteenth Day of April, 1995

Attest:

BRUCE LEHMAN

Attesting Officer

Commissioner of Patents and Trademarks